US012621955B2

(12) United States Patent
Chen et al.

(10) Patent No.: US 12,621,955 B2
(45) Date of Patent: May 5, 2026

(54) HEAT DISSIPATION DEVICE

(71) Applicant: Auras Technology Co., Ltd., New Taipei City (TW)

(72) Inventors: Chih-Wei Chen, New Taipei City (TW); Kang-Ming Fan, New Taipei City (TW); Tsung-Han Tsai, New Taipei City (TW); Fu-Hsuan Hsieh, New Taipei City (TW); Chien-Yu Liu, New Taipei City (TW)

(73) Assignee: AURAS TECHNOLOGY CO., LTD., New Taipei City (TW)

( * ) Notice: Subject to any disclaimer, the term of this patent is extended or adjusted under 35 U.S.C. 154(b) by 92 days.

(21) Appl. No.: 18/632,785

(22) Filed: Apr. 11, 2024

(65) Prior Publication Data

US 2024/0365500 A1 Oct. 31, 2024

Related U.S. Application Data

(60) Provisional application No. 63/462,108, filed on Apr. 26, 2023.

(30) Foreign Application Priority Data

Nov. 28, 2023 (TW) ................................. 112146005

(51) Int. Cl.
| | |
|---|---|
| *H05K 7/20* | (2006.01) |
| *F28D 15/02* | (2006.01) |
| *F28D 15/04* | (2006.01) |

(52) U.S. Cl.
CPC ..... *H05K 7/20154* (2013.01); *H05K 7/20336* (2013.01); *F28D 15/0275* (2013.01); *F28D 15/046* (2013.01)

(58) Field of Classification Search
CPC ............ H05K 7/20154; H05K 7/20336; F28D 15/0275; F28D 15/046; F28D 15/0216
USPC ........................................ 165/104.33, 104.26
See application file for complete search history.

(56) References Cited

U.S. PATENT DOCUMENTS

| | | | | |
|---|---|---|---|---|
| 7,697,288 B2* | 4/2010 | Okutsu | ................. | H01L 23/427 |
| | | | | 174/15.2 |
| 2005/0045310 A1* | 3/2005 | Okutsu | ................. | H01L 23/427 |
| | | | | 257/E23.099 |
| 2008/0251237 A1* | 10/2008 | Hung | ................. | H05K 7/20154 |
| | | | | 361/679.48 |

* cited by examiner

*Primary Examiner* — Joel M Attey
(74) *Attorney, Agent, or Firm* — MUNCY, GEISSLER, OLDS & LOWE, P.C.

(57) ABSTRACT

A heat dissipation device includes an inclined heat pipe and a plurality of inclined heat dissipation fins. The inclined heat pipe includes an inclined heat dissipation area, and each inclined heat dissipation fin includes an inclined heat dissipation portion. In addition, the inclined heat dissipation area of the inclined heat pipe is fixed to the inclined heat dissipation portion so that the inclined heat dissipation area of the inclined heat pipe forms a predetermined angle relative to a horizontal plane.

13 Claims, 5 Drawing Sheets

HEAT DISSIPATION DEVICE

RELATED APPLICATIONS

This application claims priorities to U.S. Provisional Application Ser. No. 63/462,108, filed Apr. 26, 2023 and Taiwan Application Serial Number 112146005, filed Nov. 28, 2023, the disclosures of which are incorporated herein by reference in their entireties.

TECHNICAL FIELD

The present disclosure relates to a heat dissipation device. More particularly, the present disclosure relates to a heat dissipation device having an inclined heat pipe.

BACKGROUND

With the advancement of technology, electronic products have become more popular, and gradually changed the life or work of many people. As the calculating power of the computers increases, the temperature control of the electronic components such as the central processing units and graphics chips is more important.

Electronic components such as the central processing units and graphics chips generate heat during operation and require proper cooling to achieve the best performance. In order to keep the central processing unit and graphics chips operating at a proper temperature, an appropriate heat dissipation device configuration may influence the performance of the electronic device.

In addition, when the appearance size of current electronic devices is getting smaller and the number of cores of the computing chip is increased, the heat generated by the computing chip is also increased. In a small space, not only the computing chip and the heat dissipation device are installed, but other mechanisms and electronic components are also installed.

Therefore, there is a need to take into account space utilization and improve heat dissipation efficiency to reduce the operating temperature of the computing chip so as to effectively improve the overall working efficiency of the electronic device.

SUMMARY

The summary of the present invention is intended to provide a simplified description of the disclosure to enable readers to have a basic understanding of the disclosure. The summary of the present invention is not a complete overview of the disclosure, and it is not intended to point out the importance of the embodiments/key elements of the present invention or define the scope of the invention.

One objective of the embodiments of the present invention is to provide a heat dissipation device to improve the heat dissipation efficiency of the heat dissipation device and further improve the overall working efficiency of the electronic device.

To achieve these and other advantages and in accordance with the objective of the embodiments of the present invention, as the embodiment broadly describes herein, the embodiments of the present invention provides a heat dissipation device including an inclined heat pipe and a plurality of inclined heat dissipation fins. The inclined heat pipe has an inclined heat dissipation area, and each of the inclined heat dissipation fins has an inclined heat dissipation portion. In addition, the inclined heat dissipation area of the inclined heat pipe is fixed to the inclined heat dissipation portion to form a predetermined angle between the inclined heat dissipation area of the inclined heat pipe and a horizontal plane.

In some embodiments, each of the inclined heat dissipation fins further includes a first heat dissipation portion connected to a bottom of the inclined heat dissipation portion to horizontally fix on a base board.

In some embodiments, each of the inclined heat dissipation fins further includes an extended heat dissipation portion connected to a top of the first heat dissipation portion and a lateral side of the inclined heat dissipation portion.

In some embodiments, the inclined heat pipe further includes a heat absorption area horizontally fixed on a heat source.

In some embodiments, each of the inclined heat dissipation fins further includes an extended air inlet located on the first heat dissipation portion to guide a cooling air into the inclined heat dissipation fins.

In some embodiments, each of the inclined heat dissipation fins further includes a wind guide protrusion to guide a cooling air toward the inclined heat dissipation portion.

In some embodiments, each of the inclined heat dissipation fins further includes a wind guide opening, and the wind guide protrusion is protruded on the wind guide opening to guide the cooling air passing through the wind guide opening.

In some embodiments, the wind guide opening and the wind guide protrusion are rectangular, triangular or polygonal.

In some embodiments, each of the inclined heat dissipation fins further includes a wind guide opening to guide a cooling air passing through the each of the inclined heat dissipation fins.

In some embodiments, the first heat dissipation portion of the each of the inclined heat dissipation fins further includes a lower inclined portion to allow at least part of a bottom of the first heat dissipation portion forming an angle with a horizontal plane.

In some embodiments, the first heat dissipation portion of the each of the inclined heat dissipation fins further includes a wind guide flange protruding on the lower inclined portion to guide a cooling air.

In some embodiments, the inclined heat dissipation portion of the each of the inclined heat dissipation fins further includes a wind guide flange to increase a contact area with the inclined heat dissipation area of the inclined heat pipe to guide a cooling air.

In some embodiments, the extended heat dissipation portion of the each of the inclined heat dissipation fins further includes an L-shaped wind guide flange to connect to the wind guide flange of the inclined heat dissipation portion.

In some embodiments, the heat dissipation device further includes a fan located on one side of the inclined heat dissipation fins to blow a cooling air to the inclined heat dissipation fins and the inclined heat dissipation area of the inclined heat pipe.

In some embodiments, the predetermined angle between the inclined heat dissipation area of the inclined heat pipe and the horizontal plane is 5 to 45 degrees.

Hence, the heat dissipation device may effectively increase the intake air flow rate of the heat dissipation fins, and at the same time effectively increase the outlet width of the heat dissipation fins, and reduce the bottleneck of cooling air flow so as to increase the heat dissipation efficiency, improve the heat dissipation quality, and increase the overall performance of electronic devices.

BRIEF DESCRIPTION OF THE DRAWINGS

The disclosure can be more fully understood by reading the following detailed description of the embodiment, with reference made to the accompanying drawings as follows.

DETAILED DESCRIPTION OF THE PREFERRED EMBODIMENT

Figure 1:
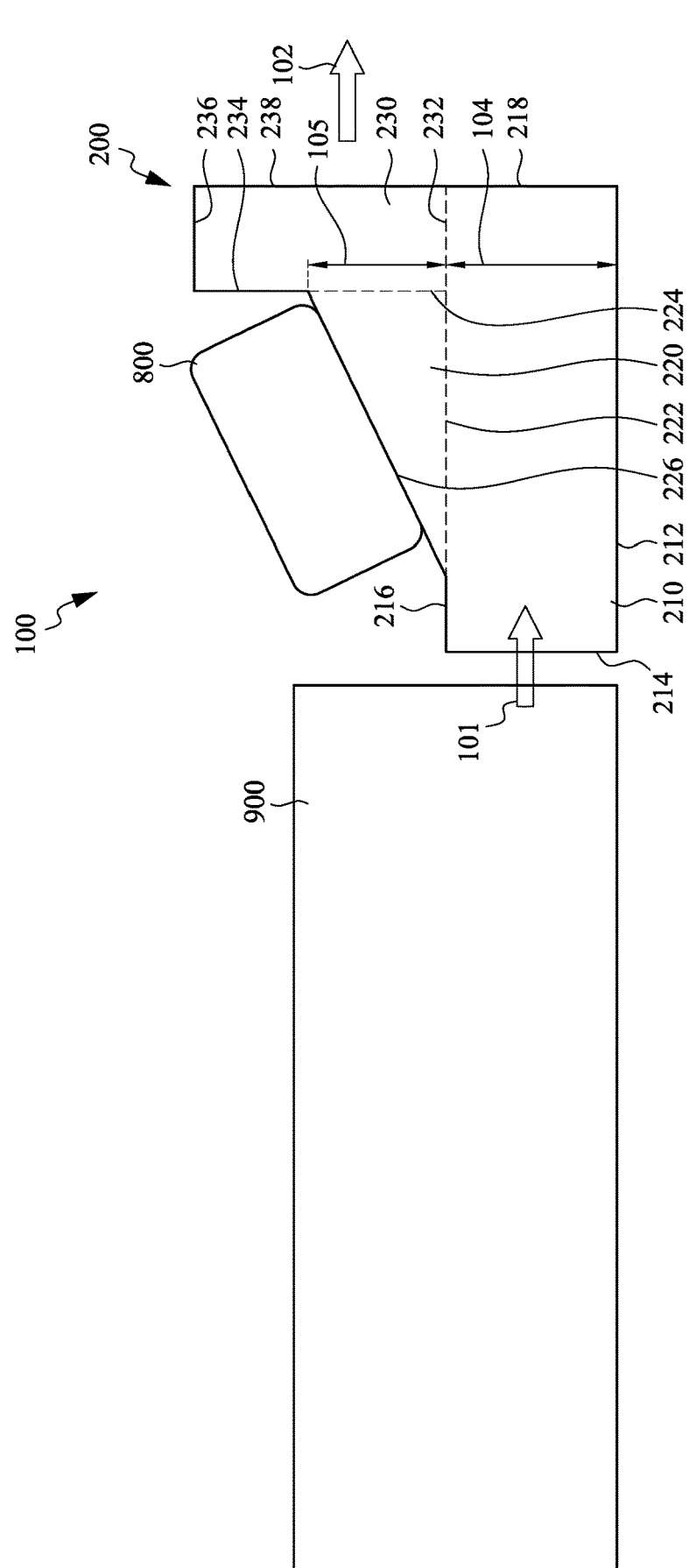
FIG. 1 illustrates a schematic side view of a heat dissipation device according to one embodiment of the present invention.

The following is a detailed description of the embodiments in conjunction with the accompanying drawings, but the provided embodiments are not intended to limit the scope of the disclosure, and the description of the structure and operation is not used to limit the execution sequence thereof. The structure of the recombination of components and the resulting devices with equal functions are all within the scope of this disclosure. In addition, the drawings are for illustration purposes only, and are not drawn according to the original scale. For ease of understanding, the same reference numbers are used in the drawings and the description to refer to the same or like parts.

In addition, the terms used in the entire description and the scope of the patent application, unless otherwise specified, usually have the usual meaning of each term used in this field, in the content disclosed here and in the special content. Some terms used to describe the disclosure are discussed below or elsewhere in this specification to provide additional guidance to those skilled in the art in the disclosure.

In the implementation mode and the scope of the present application, unless the article is specifically limited in the context, "a" and "the" can generally refer to a single or pluralities. In the steps, the numbering is only used to conveniently describe the steps, rather than to limit the sequence and implementation.

Secondly, the words "comprising", "including", "having", "containing" and the like used in the present application are all open language, meaning including but not limited to.

Figure 2:
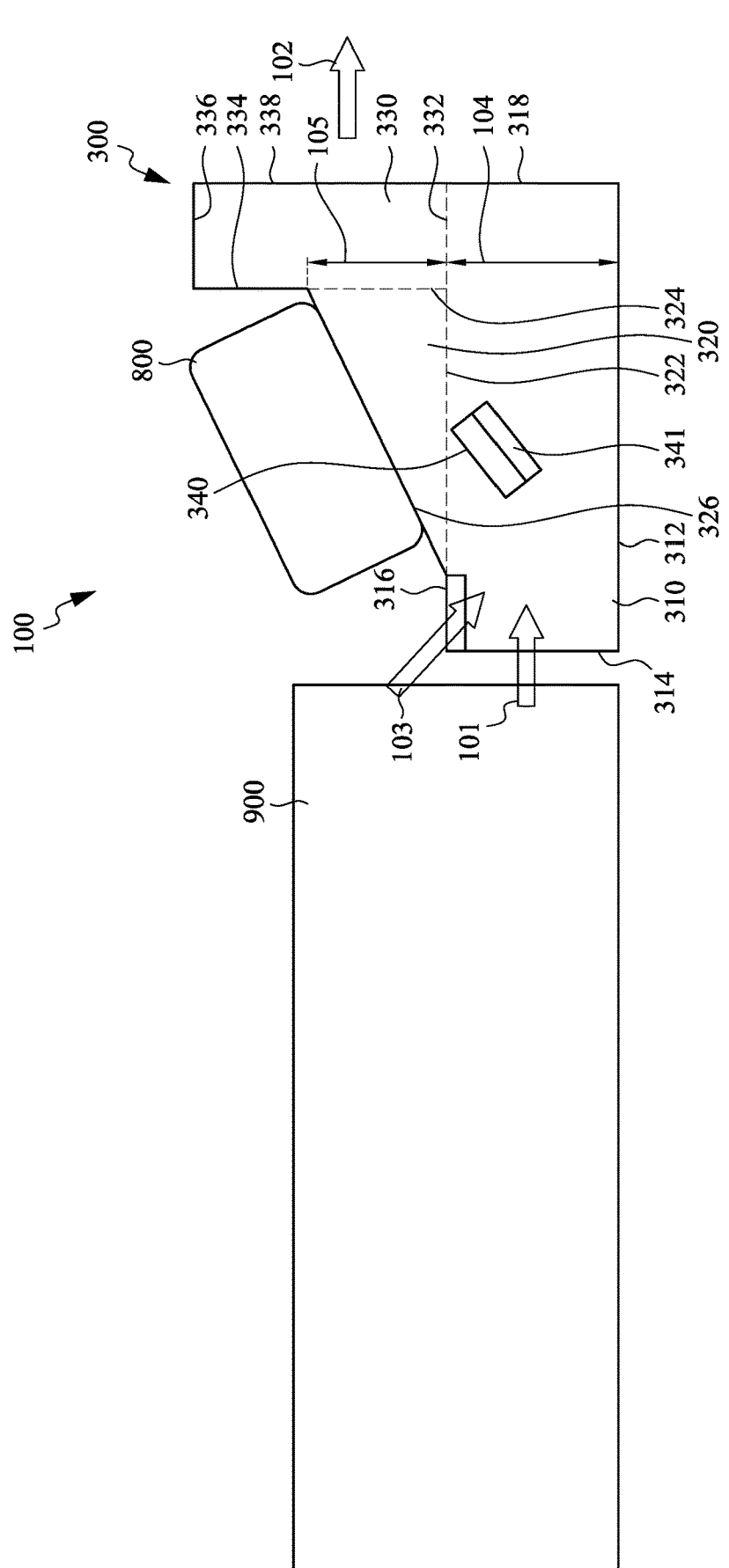
FIG. 2 illustrates a schematic side view of a heat dissipation device according to another embodiment of the present invention.
Figure 3:
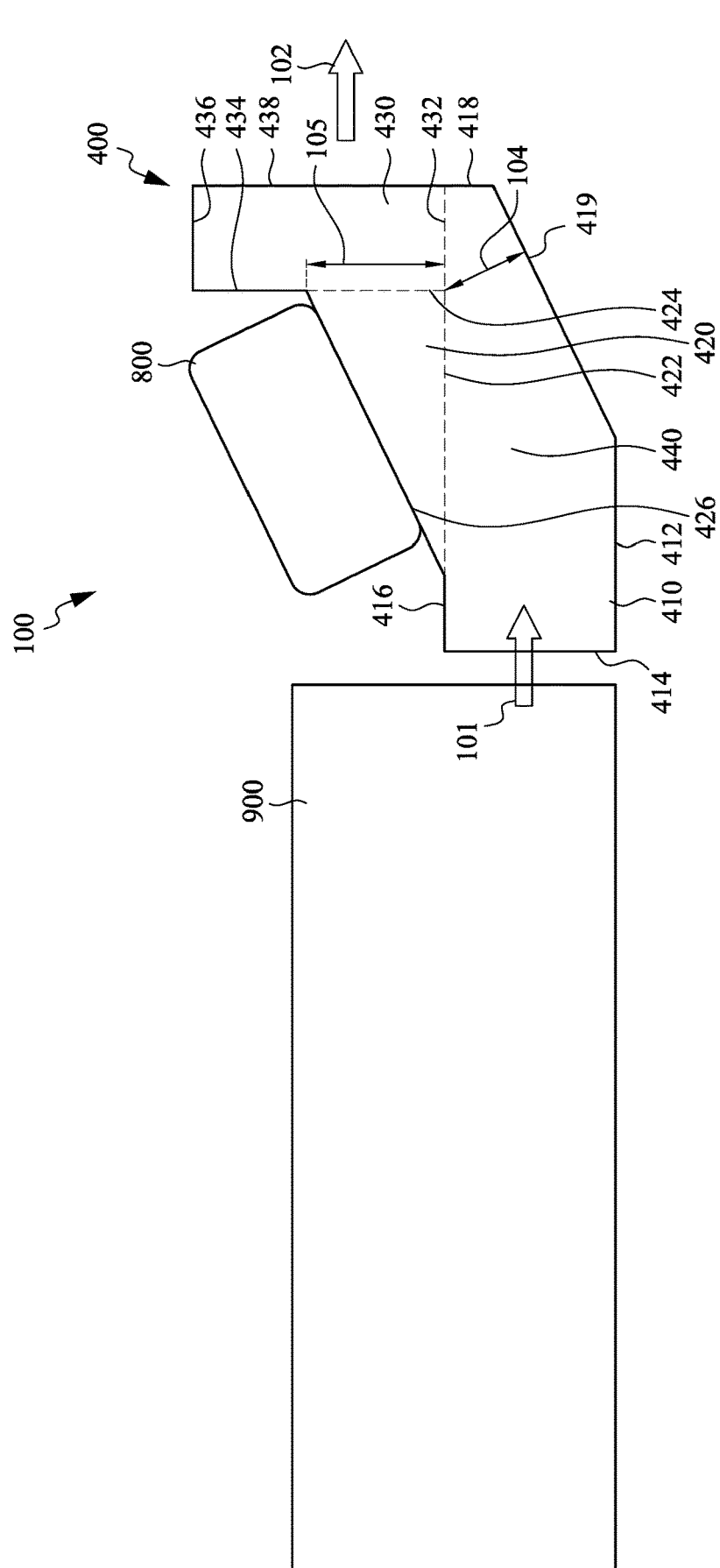
FIG. 3 illustrates a schematic side view of a heat dissipation device according to further another embodiment of the present invention.
Figure 4:
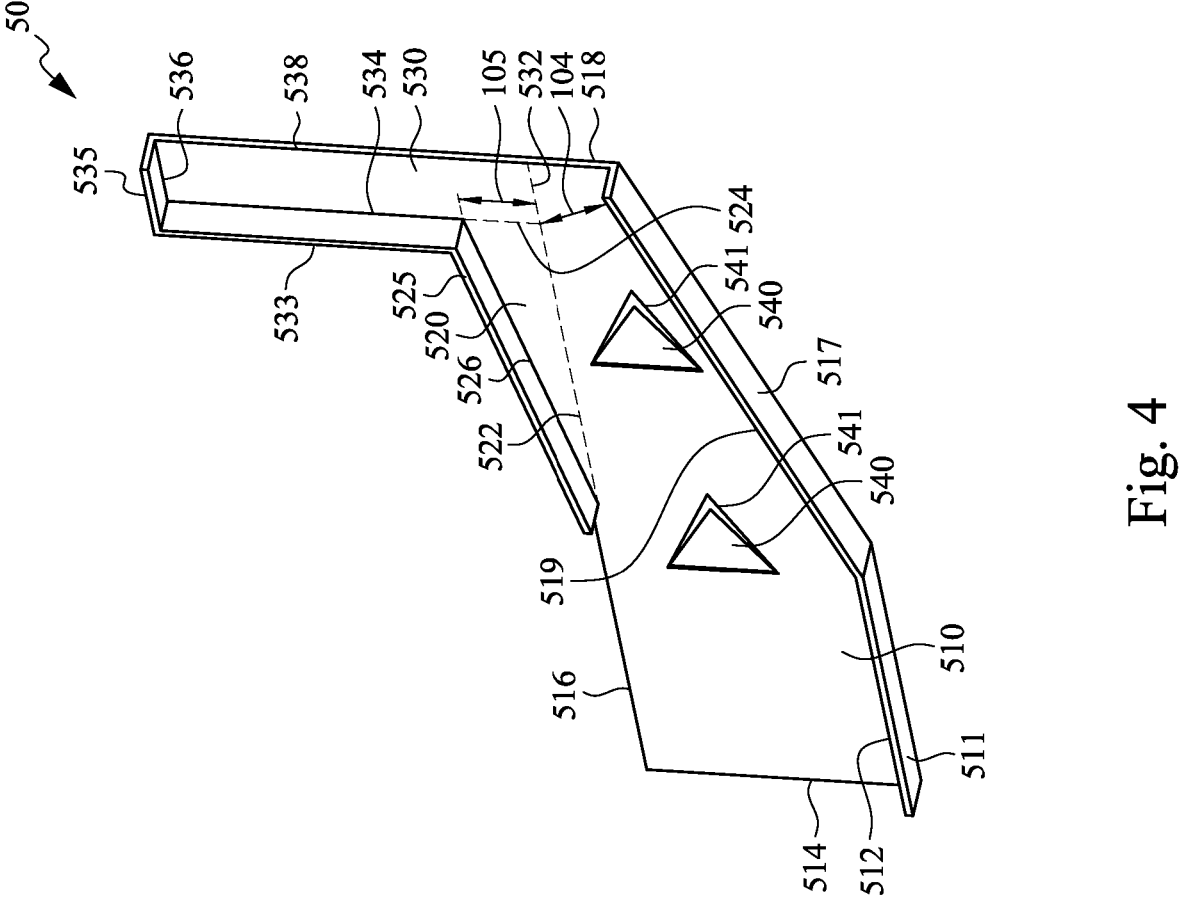
FIG. 4 illustrates a perspective diagram a heat dissipation fin of a heat dissipation device according to still another embodiment of the present invention.
Figure 5:
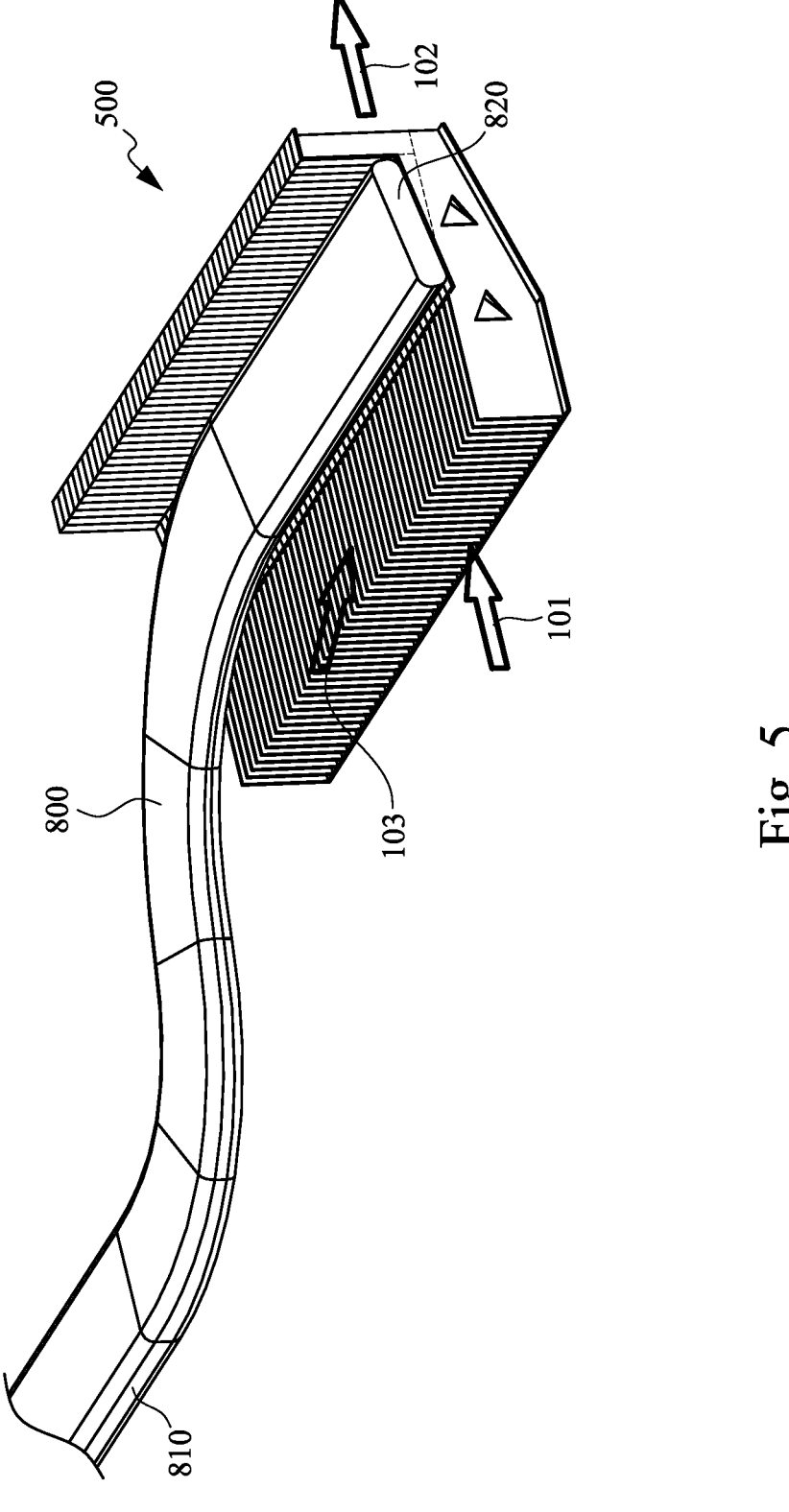
FIG. 5 illustrates a perspective diagram of a heat dissipation device according to still further another embodiment of the present invention.

FIGS. 1-3 illustrate schematic side views of the heat dissipation devices according to a plurality of embodiments of the present invention, FIG. 4 illustrates a perspective diagram the heat dissipation fin of the heat dissipation device, and FIG. 5 illustrates a perspective diagram of the heat dissipation device.

First referring to FIG. 1, the heat dissipation device 100 includes an inclined heat pipe 800 and a plurality of inclined heat dissipation fins 200. Simultaneously referring to FIG. 5, the inclined heat pipe 800 includes a heat absorption area 810 and an inclined heat dissipation area 820. An inclined heat dissipation fin 200 includes a first heat dissipation portion 210 and an inclined heat dissipation portion 220. In addition, the first heat dissipation portion 210 is connected to a bottom of the inclined heat dissipation portion 220 to horizontally fix on a base board. The inclined heat dissipation area 820 of the inclined heat pipe 800 is fixed to the bevel edge of the inclined heat dissipation portion 220 to form a predetermined angle between the inclined heat dissipation area 820 of the inclined heat pipe 800 and a horizontal plane. In some embodiments, a heat absorption area 810 of the inclined heat pipe 800 is horizontally fixed on a heat source, and the inclined heat dissipation area 820 of the inclined heat pipe 800 is rotated a predetermined angle relative to the heat absorption area 810 of the inclined heat pipe 800 to fix on the inclined heat dissipation portion 220 of the inclined heat dissipation fin 200.

In some embodiments, the first heat dissipation portion 210 includes a first side 212, a second side 214, a third side 216 and a fourth side 218 to form a rectangle. The inclined heat dissipation portion 220 includes a first side 222, a second side 224 and a third side 226 to form a triangle. In addition, the first side 222 of the inclined heat dissipation portion 220 is connected to a partial area of the third side 216 of the first heat dissipation portion 210, and preferably, integrally formed together with a partial area of the third side 216 of the first heat dissipation portion 210. In addition, the inclined heat dissipation area 820 of the inclined heat pipe 800 is fixed to the third side 226 of the inclined heat dissipation portion 220 to form a predetermined angle between the inclined heat dissipation area 820 of the inclined heat pipe 800 and a first side 222 of the inclined heat dissipation portion 220 and/or a first side 212 of the first heat dissipation portion 210. The predetermined angle is about 5 to 45 degrees, and is preferably 10 to 40 degrees, but not limited thereto. The inclinations of the inclined heat dissipation area 820 of the inclined heat pipe 800 and the third side 226 of the inclined heat dissipation portion 220 may be designed according to a practical requirement and the heat dissipation efficiency to improve the practical heat dissipation efficiency of the heat dissipation device 100, without departing from the spirit and protection scope of the present invention.

In some embodiments, the first side 222 of the inclined heat dissipation portion 220 and the first side 212 of the first heat dissipation portion 210 are preferably fixed on the base board in parallel.

In some embodiments, the inclined heat dissipation fin 200 may further include an extended heat dissipation portion 230, connected to a top of the first heat dissipation portion 210 and a lateral side of the inclined heat dissipation portion 220. For example, the extended heat dissipation portion 230 includes a first side 232, a second side 234, a third side 236 and a fourth side 238 to form a rectangle. The second side 224 of the inclined heat dissipation portion 220 is connected to a partial area of the second side 234 of the extended heat dissipation portion 230, and preferably, integrally formed together with a partial area of the second side 234 of the extended heat dissipation portion 230 to form required inclined heat dissipation fins 200.

It is worth noting that the heat dissipation device 100 further includes a fan 900 located at the second side 214 of the first heat dissipation portion 210, that is to say, located on the left side of the inclined heat dissipation fins 200 as shown in the drawing, to drive the cooling air to blow toward the inclined heat dissipation fins 200 and the inclined heat dissipation area 820 of the inclined heat pipe 800. The cooling air driven by the fan 900 may enter the inclined heat dissipation fins 200 through the air inlet 101, and pass through the first heat dissipation portion 210, the inclined heat dissipation portion 220 and the extended heat dissipation portion 230 to reach the air outlet 102. In addition, the air outlet width of the inclined heat dissipation portion 220 is gradually enlarged, referring to the inclined heat dissipation portion air outlet width 105, to effectively combine with the first heat dissipation portion air outlet width 104 of the first heat dissipation portion 210 to increase the air outlet width and avoid a bottleneck of the air outlet so as to improve the overall heat dissipation efficiency of the heat dissipation device 100.

Referring to FIG. 2, the heat dissipation device 100 includes an inclined heat pipe 800 and a plurality of inclined heat dissipation fins 300. An inclined heat dissipation fin 300 includes a first heat dissipation portion 310 and an inclined heat dissipation portion 320. In addition, the first heat dissipation portion 310 is connected to a bottom of the inclined heat dissipation portion 320 to horizontally fix on a base board. The inclined heat dissipation area 820 of the inclined heat pipe 800 is fixed to the bevel edge of the inclined heat dissipation portion 320 to form a predetermined angle between the inclined heat dissipation area 820 of the inclined heat pipe 800 and a horizontal plane.

In some embodiments, the first heat dissipation portion 310 includes a first side 312, a second side 314, a third side 316 and a fourth side 318 to form a rectangle. The inclined heat dissipation portion 320 includes a first side 322, a second side 324 and a third side 326 to form a triangle. In addition, the first side 322 of the inclined heat dissipation portion 320 is connected to a partial area of the third side 316 of the first heat dissipation portion 310, and preferably, integrally formed together with a partial area of the third side 316 of the first heat dissipation portion 310. In addition, the inclined heat dissipation area 820 of the inclined heat pipe 800 is fixed to the third side 326 of the inclined heat dissipation portion 320 to form a predetermined angle between the inclined heat dissipation area 820 of the inclined heat pipe 800 and a first side 322 of the inclined heat dissipation portion 320 and/or a first side 312 of the first heat dissipation portion 310. The predetermined angle is about 5 to 45 degrees, and is preferably 10 to degrees, but not limited thereto. The inclinations of the inclined heat dissipation area 820 of the inclined heat pipe 800 and the third side 326 of the inclined heat dissipation portion 320 may be designed according to a practical requirement and the heat dissipation efficiency to improve the practical heat dissipation efficiency of the heat dissipation device 100, without departing from the spirit and protection scope of the present invention.

In some embodiments, the first side 322 of the inclined heat dissipation portion 320 and the first side 312 of the first heat dissipation portion 310 are preferably fixed on the base board in parallel.

In some embodiments, the inclined heat dissipation fin 300 may further include an extended heat dissipation portion 330, connected to a top of the first heat dissipation portion 310 and a lateral side of the inclined heat dissipation portion 320. For example, the extended heat dissipation portion 330 includes a first side 332, a second side 334, a third side 336 and a fourth side 338 to form a rectangle. The second side 324 of the inclined heat dissipation portion 320 is connected to a partial area of the second side 334 of the extended heat dissipation portion 330, and preferably, integrally formed together with a partial area of the second side 334 of the extended heat dissipation portion 330 to form required inclined heat dissipation fins 300.

It is worth noting that the heat dissipation device 100 further includes a fan 900 located at the second side 314 of the first heat dissipation portion 310, that is to say, located on the left side of the inclined heat dissipation fins 300 as shown in the drawing, to drive the cooling air to blow toward the inclined heat dissipation fins 300 and the inclined heat dissipation area 820 of the inclined heat pipe 800. The cooling air driven by the fan 900 may enter the inclined heat dissipation fins 300 through the air inlet 101 and an extended air inlet 103, and pass through the first heat dissipation portion 310, the inclined heat dissipation portion 320 and the extended heat dissipation portion 330 to reach the air outlet 102.

In addition, the extended air inlet 103 is located on a portion, uncovered by the inclined heat dissipation portion 320, of the third side 316 of the first heat dissipation portion 310 to further guide the cooling air entering the inclined heat dissipation fins 300.

In some embodiments, the inclined heat dissipation fin 300 further includes a wind guide protrusion 340 to guide the cooling air toward the inclined heat dissipation portion 320 to effectively improve the overall heat dissipation efficiency of the heat dissipation device 100.

In some embodiments, the inclined heat dissipation fin 300 further includes a wind guide opening 341 to allow the cooling air conveniently passing through the inclined heat dissipation fins 300 to effectively improve the overall heat dissipation efficiency of the heat dissipation device 100.

In some embodiments, the inclined heat dissipation fin 300 includes a wind guide protrusion 340 and a wind guide opening 341, and the wind guide protrusion 340 is protruded on one side of the wind guide opening 341 to guide the cooling air passing through the wind guide opening 341 to effectively improve the overall heat dissipation efficiency of the heat dissipation device 100.

In some embodiments, the wind guide opening 341 and the wind guide protrusion 340 are rectangular, triangular or polygonal, but not limited thereto.

It is worth noting that, in the present embodiment, the inclined heat dissipation fin 300 may have a gradually enlarged air outlet with the inclined heat dissipation portion 320, referring to the inclined heat dissipation portion air outlet width 105, to effectively combine with the first heat dissipation portion air outlet width 104 of the first heat dissipation portion 310 to increase the air outlet width and avoid a bottleneck of the air outlet so as to improve the overall heat dissipation efficiency of the heat dissipation device 100.

Referring to FIG. 3, the heat dissipation device 100 includes an inclined heat pipe 800 and a plurality of inclined heat dissipation fins 400. An inclined heat dissipation fin 400 includes a first heat dissipation portion 410 and an inclined heat dissipation portion 420. In addition, the first heat dissipation portion 410 is connected to a bottom of the inclined heat dissipation portion 420 to horizontally fix on a base board. The inclined heat dissipation area 820 of the inclined heat pipe 800 is fixed to the bevel edge of the inclined heat dissipation portion 420 to form a predetermined angle between the inclined heat dissipation area 820 of the inclined heat pipe 800 and a horizontal plane.

In some embodiments, the first heat dissipation portion 410 includes a first side 412, a second side 414, a third side 416 and a fourth side 418 and a lower inclined portion 419 to form a pentagon. The inclined heat dissipation portion 420 includes a first side 422, a second side 424 and a third side 426 to form a triangle. In addition, the first side 422 of the inclined heat dissipation portion 420 is connected to a partial area of the third side 416 of the first heat dissipation portion 410, and preferably, integrally formed together with a partial area of the third side 416 of the first heat dissipation portion 410. In addition, the inclined heat dissipation area 820 of the inclined heat pipe 800 is fixed to the third side 426 of the inclined heat dissipation portion 420 to form a predetermined angle between the inclined heat dissipation area 820 of the inclined heat pipe 800 and a first side 422 of the inclined heat dissipation portion 420 and/or a first side 412 of the first heat dissipation portion 410. The predetermined angle is about 5 to 45 degrees, and is preferably 10 to 40 degrees, but not limited thereto. The inclinations of the inclined heat dissipation area 820 of the inclined heat pipe 800 and the third side 426 of the inclined heat dissipation portion 420 may be designed according to a practical requirement and the heat dissipation efficiency to improve the practical heat dissipation efficiency of the heat dissipation device 100, without departing from the spirit and protection scope of the present invention.

In some embodiments, the first side 422 of the inclined heat dissipation portion 420 and the first side 412 of the first heat dissipation portion 410 are preferably fixed on the base board in parallel.

In some embodiments, the inclined heat dissipation fin 400 may further include an extended heat dissipation portion 430, connected to a top of the first heat dissipation portion 410 and a lateral side of the inclined heat dissipation portion 420. For example, the extended heat dissipation portion 430 includes a first side 432, a second side 434, a third side 436 and a fourth side 438 to form a rectangle. The second side 424 of the inclined heat dissipation portion 420 is connected to a partial area of the second side 434 of the extended heat dissipation portion 430, and preferably, integrally formed together with a partial area of the second side 434 of the extended heat dissipation portion 430 to form required inclined heat dissipation fins 400.

Similarly, a fan 900 is located at the second side 414 of the first heat dissipation portion 410, that is to say, located on the left side of the inclined heat dissipation fins 400 as shown in the drawing, to drive the cooling air to blow toward the inclined heat dissipation fins 400 and the inclined heat dissipation area 820 of the inclined heat pipe 800. The cooling air driven by the fan 900 may enter the inclined heat dissipation fins 400 through the air inlet 101, and pass through the first heat dissipation portion 410, the inclined heat dissipation portion 420 and the extended heat dissipation portion 430 to reach the air outlet 102.

It is worth noting that, in the present embodiment, the lower inclined portion 419 of the first heat dissipation portion 410 of the inclined heat dissipation fin 400 is connected between the first side 412 and the fourth side 418 of the first heat dissipation portion 410 to form an angle between the bottom of the first heat dissipation portion 410 and the horizontal plane to form a reservoir space. Therefore, some electronic components and structures may be stored under the heat dissipation device 100 by way of the lower inclined portion 419, and the inclined heat dissipation portion 420 of the inclined heat dissipation fin 400 may form a gradually enlarged air outlet, referring to the inclined heat dissipation portion air outlet width 105, to effectively combine with the first heat dissipation portion air outlet width 104 of the first heat dissipation portion 410 to increase the air outlet width and avoid a bottleneck of the air outlet and a reduced air outlet width of the first heat dissipation portion 410 so as to improve the overall heat dissipation efficiency of the heat dissipation device 100.

Referring to FIG. 4, a perspective diagram of an inclined heat dissipation fin 500 is illustrated, as shown in the drawing, an inclined heat dissipation fin 500 includes a first heat dissipation portion 510 and an inclined heat dissipation portion 520. In addition, the first heat dissipation portion 510 is connected to a bottom of the inclined heat dissipation portion 520.

The first heat dissipation portion 510 includes a first side 512, a second side 514, a third side 516 and a fourth side 518 and a lower inclined portion 519 to form a pentagon. In addition, the lower inclined portion 519 is connected between the first side 512 and the fourth side 518 of the first heat dissipation portion 510 to form an angle between at least part of the bottom of the first heat dissipation portion 510 and the horizontal plane.

In addition, the inclined heat dissipation portion 520 includes a first side 522, a second side 524 and a third side 526 to form a triangle. The first side 522 of the inclined heat dissipation portion 520 is connected to a partial area of the third side 516 of the first heat dissipation portion 510, and preferably, integrally formed together with a partial area of the third side 516 of the first heat dissipation portion 510. In addition, the third side 526 of the inclined heat dissipation portion 520 is fixed to the inclined heat dissipation area of the inclined heat pipe.

In some embodiments, the first side 522 of the inclined heat dissipation portion 520 and the first side 512 of the first heat dissipation portion 510 are preferably fixed on the base board in parallel.

In some embodiments, the inclined heat dissipation fin 500 may further include an extended heat dissipation portion 530, connected to a top of the first heat dissipation portion 510 and a lateral side of the inclined heat dissipation portion 520. For example, the extended heat dissipation portion 530 includes a first side 532, a second side 534, a third side 536 and a fourth side 538 to form a rectangle. The second side 524 of the inclined heat dissipation portion 520 is connected to a partial area of the second side 534 of the extended heat dissipation portion 530, and preferably, integrally formed together with a partial area of the second side 534 of the extended heat dissipation portion 530 to form required inclined heat dissipation fins 500.

It is worth noting that, the inclined heat dissipation fin 500 further includes a wind guide flange 511 protruding on the first side 512 of the first heat dissipation portion 510, a wind guide flange 525 protruding on the third side 526 of the inclined heat dissipation portion 520, and a wind guide flange 517 protruding on the lower inclined portion 519 of the first heat dissipation portion 510. After a plurality of the inclined heat dissipation fins 500 are stacked together, the cooling air channels are formed therein to effectively increase the heat dissipation efficiency of the heat dissipation device 100.

In some embodiments, the wind guide flange 525 protruding on the third side 526 of the inclined heat dissipation portion 520 may guide the cooling air and further increase the contact area with the inclined heat dissipation area of the inclined heat pipe 800 so as to increase the heat dissipation efficiency.

In addition, a wind guide flange 533 protruding on the second side 534 of the extended heat dissipation portion 530 and a wind guide flange 535 protruding on the third side 536 of the extended heat dissipation portion 530 are formed an L-shaped wind guide flange and connected to the wind guide flange 525 of the inclined heat dissipation portion 520 so as to further guide the air flow of the cooling air to further increase the heat dissipation efficiency of the heat dissipation device 100.

Referring to FIG. 5, FIG. 5 is a perspective diagram of a plurality of inclined heat dissipation fins 500 as shown in FIG. 4 assembled with the inclined heat pipe 800. Therefore, the second side 514 of the first heat dissipation portion 510 is formed an air inlet 101, and a part, unconnected with inclined heat dissipation portion 520, of the third side 516 may formed an extended air inlet 103 to increase the intake air flow rate of the inclined heat dissipation fins 500 so as to further increase the heat dissipation efficiency of the heat dissipation device 100.

In some embodiments, the inclined heat dissipation fin 500 further includes a wind guide protrusion 540 to guide the cooling air toward the inclined heat dissipation portion 520 so as to effectively increase the overall heat dissipation efficiency of the heat dissipation device 100.

In some embodiments, the inclined heat dissipation fin 500 further includes a wind guide opening 541 to allow the cooling air conveniently passing through the inclined heat dissipation fins 500 so as to effectively increase the overall heat dissipation efficiency of the heat dissipation device 100.

In some embodiments, the inclined heat dissipation fin 500 further includes a wind guide protrusion 540 and a wind guide opening 541 and the wind guide protrusion 540 is protruded on one side of the wind guide opening 541 to guide the cooling air passing through the wind guide opening 541 so as to effectively increase the overall heat dissipation efficiency of the heat dissipation device 100.

In some embodiments, the wind guide opening 541 and the wind guide protrusion 540 are triangular, but not limited thereto.

In some embodiments, some electronic components and structures may be stored under the heat dissipation device 100 by way of the lower inclined portion 519 of the first heat dissipation portion 510 of the inclined heat dissipation fin 500, and the inclined heat dissipation portion 520 of the inclined heat dissipation fin 500 may form a gradually enlarged air outlet, referring to the inclined heat dissipation portion air outlet width 105, to effectively combine with the first heat dissipation portion air outlet width 104 of the first heat dissipation portion 510 to increase the air outlet width and avoid a bottleneck of the air outlet and a reduced air outlet width of the first heat dissipation portion 510 so as to improve the overall heat dissipation efficiency of the heat dissipation device 100.

In some embodiments, the inclined heat pipe is a flat heat pipe.

Accordingly, the heat dissipation device disclosed in the present disclosure may effectively increase the intake air flow rate of the heat dissipation fins, and at the same time effectively increase the outlet width of the heat dissipation fins, and reduce the bottleneck of cooling air flow so as to increase the heat dissipation efficiency, improve the heat dissipation quality, and increase the overall performance of electronic devices.

Although the present disclosure has been disclosed above in terms of implementation, it is not intended to limit the present disclosure. Any person with ordinary knowledge in the field may make various variations and modifications without departing from the spirit and scope of the disclosure. Therefore, the spirit and scope of the appended claims should not be limited to the description of the embodiments contained herein.

What is claimed is:

1. A heat dissipation device, comprising:
   an inclined heat pipe having an inclined heat dissipation area; and
   a plurality of inclined heat dissipation fins, each of the inclined heat dissipation fins having an inclined heat dissipation portion, wherein the inclined heat dissipation area of the inclined heat pipe is fixed to the inclined heat dissipation portion to form a predetermined angle between the inclined heat dissipation area of the inclined heat pipe and a horizontal plane,
   a first heat dissipation portion connected to a bottom of the inclined heat dissipation portion to horizontally fix on a base board,
   wherein the first heat dissipation portion of the each of the inclined heat dissipation fins further comprises:
      a lower inclined portion to allow at least part of a bottom of the first heat dissipation portion forming an angle with a horizontal plane.

2. The heat dissipation device of claim 1, wherein each of the inclined heat dissipation fins further comprises:
   an extended heat dissipation portion connected to a top of the first heat dissipation portion and a lateral side of the inclined heat dissipation portion.

3. The heat dissipation device of claim 1, wherein the inclined heat pipe further comprises:
   a heat absorption area horizontally fixed on a heat source.

4. The heat dissipation device of claim 1, wherein each of the inclined heat dissipation fins further comprises:
   an extended air inlet located on the first heat dissipation portion to guide a cooling air into the inclined heat dissipation fins.

5. The heat dissipation device of claim 1, wherein each of the inclined heat dissipation fins further comprises:
   a wind guide protrusion to guide a cooling air toward the inclined heat dissipation portion.

6. The heat dissipation device of claim 5, wherein each of the inclined heat dissipation fins further comprises:
   a wind guide opening, wherein the wind guide protrusion is protruded on the wind guide opening to guide the cooling air passing through the wind guide opening.

7. The heat dissipation device of claim 6, wherein the wind guide opening and the wind guide protrusion are rectangular, triangular or polygonal.

8. The heat dissipation device of claim 1, wherein each of the inclined heat dissipation fins further comprises:
   a wind guide opening to guide a cooling air passing through the each of the inclined heat dissipation fins.

9. The heat dissipation device of claim 1, wherein the first heat dissipation portion of the each of the inclined heat dissipation fins further comprises:
   a wind guide flange protruding on the lower inclined portion to guide a cooling air.

10. The heat dissipation device of claim 2, wherein the inclined heat dissipation portion of the each of the inclined heat dissipation fins further comprises:
   a wind guide flange to increase a contact area with the inclined heat dissipation area of the inclined heat pipe to guide a cooling air.

11. The heat dissipation device of claim 10, wherein the extended heat dissipation portion of the each of the inclined heat dissipation fins further comprises:
   an L-shaped wind guide flange to connect to the wind guide flange of the inclined heat dissipation portion.

12. The heat dissipation device of claim 1, further comprising a fan located on one side of the inclined heat dissipation fins to blow a cooling air to the inclined heat dissipation fins and the inclined heat dissipation area of the inclined heat pipe.

13. The heat dissipation device of claim 1, wherein the predetermined angle between the inclined heat dissipation area of the inclined heat pipe and the horizontal plane is 5 to 45 degrees.

* * * * *